United States Patent [19]
Kumar

[11] Patent Number: 5,526,314
[45] Date of Patent: Jun. 11, 1996

[54] TWO MODE SENSE AMPLIFIER WITH LATCH

[75] Inventor: Manoj Kumar, Austin, Tex.

[73] Assignee: International Business Machines Corporation, Armonk, N.Y.

[21] Appl. No.: 352,659

[22] Filed: Dec. 9, 1994

[51] Int. Cl.$^6$ ........................................... G11C 7/02
[52] U.S. Cl. .................... 365/207; 365/205; 365/208; 327/51; 327/52; 327/57
[58] Field of Search ...................... 330/252; 365/207, 365/208, 189.05, 205; 327/51, 52, 55, 57

[56] References Cited

U.S. PATENT DOCUMENTS

| | | |
|---|---|---|
| 4,253,163 | 2/1981 | Komoriya et al. . |
| 4,421,996 | 12/1983 | Chuang et al. . |
| 4,680,735 | 7/1987 | Miyamoto et al. . |
| 4,751,681 | 6/1988 | Hashimoto ............................ 365/207 |
| 4,816,706 | 3/1989 | Dhong et al. . |
| 4,831,287 | 5/1989 | Golab .................................. 365/207 X |
| 4,845,675 | 7/1989 | Krenik et al. ........................ 327/57 X |
| 5,036,460 | 7/1991 | Takahira et al. . |
| 5,151,879 | 9/1992 | Hsueh et al. ..................... 365/189.05 X |
| 5,231,318 | 7/1993 | Reddy . |
| 5,239,506 | 8/1993 | Dachtera et al. ................... 365/189.05 |

*Primary Examiner*—David C. Nelms
*Assistant Examiner*—Son Dinh
*Attorney, Agent, or Firm*—Mark E. McBurney; Andrew J. Dillon; Keith L. Hargrove

[57] ABSTRACT

A sense amplifier apparatus for use in a memory array having a plurality of memory cells is provided. The sense amplifier apparatus includes a differential sense amplifier and a dynamic sense amplifier. The differential sense amplifier has a first set of switches for driving the voltages of the sense amplifier apparatus and are coupled to a complementary pair of outputs. Also provided are a second set of switches, which are coupled to a complementary pair of input lines so as to amplify the input signal on either of the pair of input lines to a first signal level at a first rate of amplification. The dynamic sense amplifier shares the first set of switches with the differential sense amplifier and further includes a third set of switches that are coupled to a complementary pair of input lines and the output lines and also a sense enable line. This allows the first signal level to be amplified to a second signal level at a second rate of amplification faster than the first rate of amplification.

15 Claims, 4 Drawing Sheets

TWO MODE SENSE AMPLIFIER WITH LATCH

BACKGROUND OF THE INVENTION

1. Technical Field

The present invention relates generally to sense amplifier circuits, and, more particularly, to sense amplifier circuits for use in memory arrays using transistor memory cells. More specifically, the present invention relates to a two mode sense amplifier for use in a memory array using either static RAM or dynamic RAM transistors that includes a latch for driving the output data.

2. Description of the Related Art

Sense amplifiers for use in memory arrays are well-known. A typical sense amplifier is used to detect low-level signals received from the cells within the memory array and convert the signals to levels compatible with the rest of the system in which the memory is used. As memory density increases, the memory cell size and the corresponding cell output signal is reduced, thereby making the sense amplifier critical for high-speed applications. The sense amplifier should be highly sensitive and still meet the speed requirements of the high-density memories.

A conventional sense amplifier detects the memory cell output through a differential amplifier, which is highly sensitive, but has very small voltage gain. The sense amplifier requires a biasing circuit that uses static power and is also supply voltage and process sensitive.

Separate latch circuits are also provided to hold the output data to drive the next stage. These additional circuits typically induce added delay in the sense amplifier.

SUMMARY OF THE INVENTION

It is therefore one object of the present invention to provide sense amplifier circuits.

It is another object of the present invention to provide sense amplifier circuits for use in memory arrays using transistor memory cells.

It is yet another object of the present invention to provide a two mode sense amplifier for use in a memory array using either static RAM or DRAM transistors that include a latch for driving the output data.

The foregoing objects are achieved as is now described. According to the present invention, a sense amplifier apparatus for use in a memory array having a plurality of memory cells is provided. The sense amplifier apparatus includes a differential sense amplifier mode and a dynamic sense amplifier mode. A complementary pair of input lines and output lines are provided as well as a sense enable line and a latch enable line. A latch is also provided, which is coupled to the output lines and is used to drive these lines. Separately, a precharge circuit is connected to the input lines for precharging the complementary pair of input lines and an output precharge circuit is also provided for precharging the complementary pair of output lines. The differential sense amplifier mode has a first set of switches for driving the voltages of the sense amplifier apparatus and are coupled to the complementary pair of outputs. Also provided are a second set of switches, which are coupled to the complementary pair of input lines and sense enabling line (SE) so as to amplify the input signal on either of the pair of input lines to a first signal level at a first rate of amplification. The dynamic sense amplifier shares the first set of switches with the differential sense amplifier and further includes a third set of switches that are coupled to the output lines and also to the latch enable line (LE). This allows the first signal level to be amplified to a second signal level at a second rate of amplification faster than the first rate of amplification. The latch is used to maintain the amplified signal at about the same level as the second signal level. The amplifiers are designed so that a pair of switches within the second set of switches are coupled one to another and to the complementary pair of input lines so as to greatly reduce the impedance normally seen by the input signal. The sense amplifier provides means to support precharging of the complementary pairs of output and input lines in preparation for the next operation cycle.

In one embodiment, the memory array is a CMOS memory array and has a memory signal output line and a circuit for sensing and amplifying the output on the memory signal output line. The circuit for sensing and amplifying also includes a differential amplifier circuit, which is precharged to a predetermined level prior to a sense operation. A dynamic amplifier is also provided, which incorporates a latch circuit and is coupled to an output from the differential output circuit. Means are also provided, being coupled to the differential amplifier and responsive to the memory output signal, for initiating a sense operation and for driving the differential amplifier circuit. Additionally, the dynamic amplifier circuit is coupled to means for driving the dynamic amplifier circuit. The sense amplifier also includes means to use the amplifier drivers to drive test signals during chip testing by turning off the amplifier mode and supplying test signals to the input of the sense amplifier output drivers. The switches are typically N-FET and P-FET CMOS gate transistors.

The above as well as additional objects, features, and advantages of the present invention will become apparent in the following detailed written description.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

DETAILED DESCRIPTION OF THE PREFERRED EMBODIMENT

Figure 1:
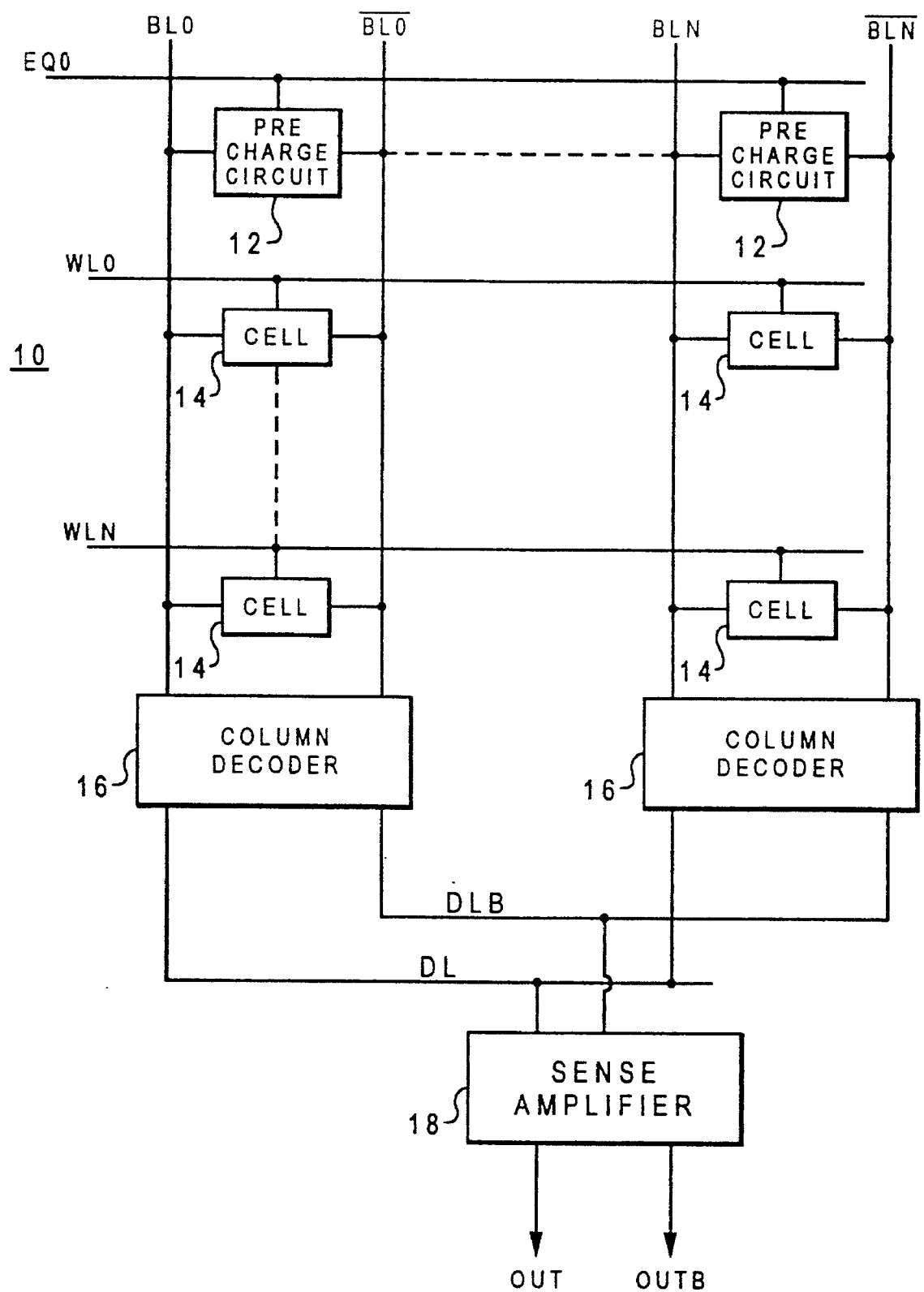
FIG. 1 depicts in accordance with a preferred embodiment of the present invention a SRAM, which includes a plurality of precharged circuits.

The present invention is directed to an improved sense amplifier used within a static random access memory (SRAM) or dynamic RAM (DRAM). FIG. 1 depicts SRAM 10, which includes a plurality of precharged circuits 12, which are used to restore or precharge the bit line (BL) and the inverted bit line ($\overline{BL}$) to VDD at the end of each array access. Each bit line and its complementary line, BL and $\overline{BL}$, are further connected to a plurality of cells 14 within the array. Each cell along a row is controlled by a word line (WL). There are n word lines for n rows of cells. Each bit line BL and $\overline{BL}$ further connect to column decoder 16. The output from column decoder 16 further connect to sense amplifier 18 via data line DL and $\overline{DL}$. Sense amplifier includes further outputs OUT and $\overline{OUT}$. The DL and $\overline{DL}$ and OUT and $\overline{OUT}$ lines are precharged to VDD at the end of each cycle in preparation for the next cycle. Whenever the word line WL goes high, it selects a particular memory cell on that row. Depending upon the data stored in the memory cell 14, one bit line BL or $\overline{BL}$ will stay high while the other bit line will discharge. Additionally, one of the column decoders 16 is selected, such as, for example, in a 8:1 decoding arrangement, and BL and $\overline{BL}$ drive the respective DL and $\overline{DL}$ lines.

Figure 2:
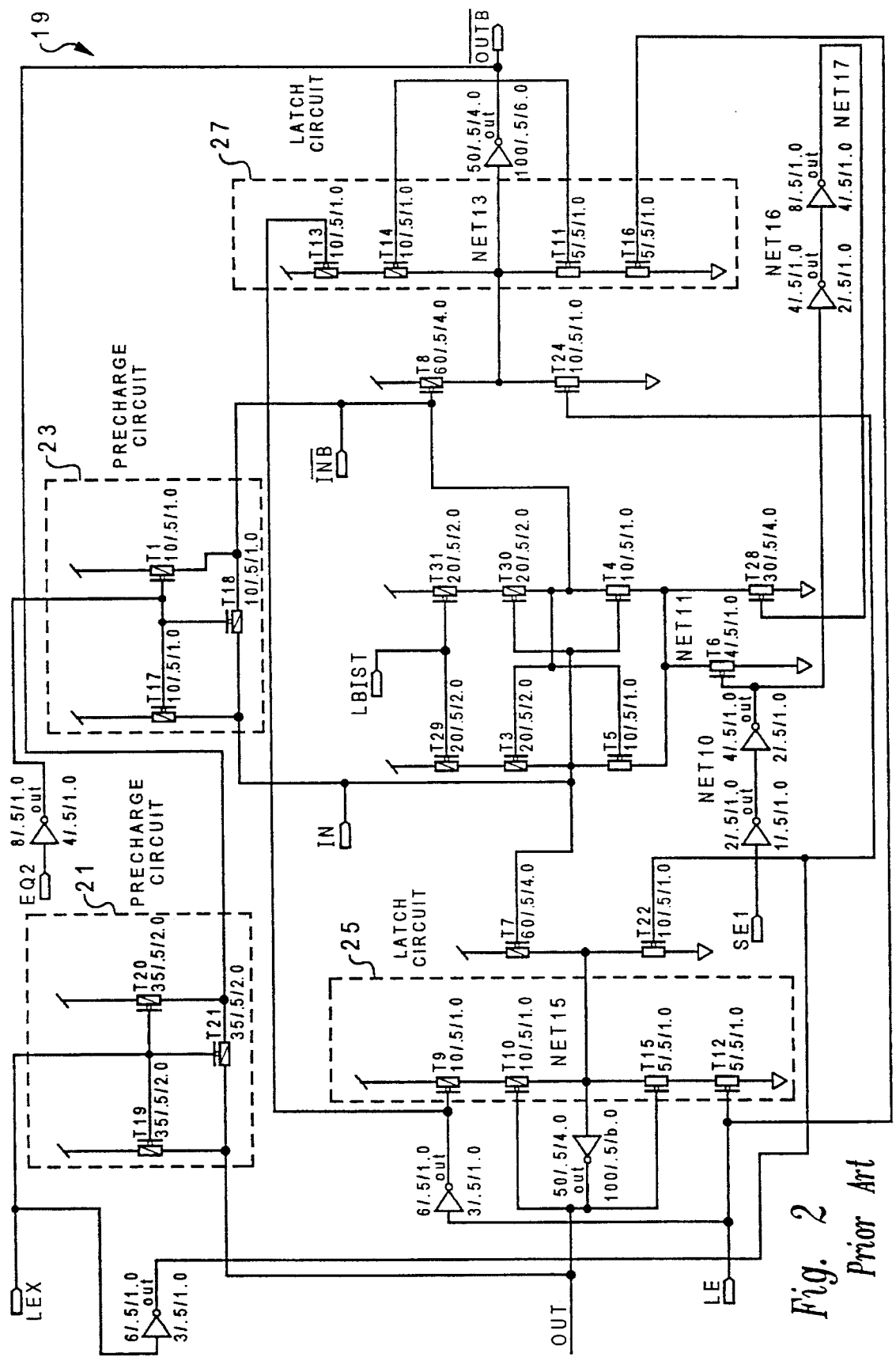
FIG. 2 illustrates a prior art sense amplifier.

Sense amplifier 18 is used to amplify the differential signal from memory cell 14 in the array design of SRAM 10. A typical SRAM 10 uses a six transistor cell. Each memory cell 14 must be able to drive a long column decoder IN, $\overline{IN}$. For example, in the case of the present invention, it is desired that the bit lines be able to develop a 250 millivolt (mv) difference on the data lines within a 10 to 600 picosecond time frame once the word line goes high. Next, the 250 millivolts differential voltage is then further amplified in a short time period. The time period for 250 millivolt differential voltage is established for the input to set the sense amplifier since if the process deviates toward the slower process time, there would still be a large enough differential voltage on the input to the sense amplifier. Additionally, a latch is used after the sense amplifier to keep driving the data from the array, amplified by the sense amplifier 18, to a comparator, MUX, or Array Built In Self-Test (ABIST) or a combination of the three, while the bit lines are precharged and the inputs to sense amplifier 18 are readied for the next cycle. Prior sense amplifiers were incapable of driving other circuits whose total capacitance is more than one picofarad of load; therefore, drivers were necessary to drive the signal from the sense amplifiers. A prior art sense amplifier 19 is illustrated in FIG. 2. Sense amplifier 19 includes a pair of precharge circuits 21 and 23, which further connect to a pair of latch circuits 25 and 27. Coupled between latch circuits 25 and 27, are the transistors comprising the sense amplifier portion of sense amplifier 19.

Both precharge circuits use a 3-transistor design, with precharge circuit 21 prestaging control or equalization LEX line and further driving OUT and $\overline{OUT}$ lines. Precharge circuit 23 prestages equalization EQ line and is further connected to the sense amplifier circuitry, which comprises transistors T3, T4, T5, T29, T31, and T30. Transistors T23, T29, T30, and T31 are P channel field effect transistors (FET) while transistors T4 and T5 are N channel FETs. IN and $\overline{IN}$ lines are precharged by precharge circuit 23 and further connect to the sense amplifier portion of sense amplifier 19. IN line is further connected to latch circuit 25 and $\overline{IN}$ line is connected to latch circuit 27. Unfortunately, sense amplifier 19 suffers from several problems.

One problem is that sense amplifier 19 has infinite gain. Accordingly, if sense amplifier 19 senses the wrong data, it never recovers. This leads to wrong data being sent to the output. A second problem is that it is slow because of high input capacitance, which is developed by the input capacitance from the gate and junction of the transistors. Once the word line goes high, about 913 picoseconds pass before it develops the adequate 250 millivolt differential voltage on the input of the sense amplifier by the memory cell. Once the sense amplifier reaches 250 millivolts differential voltage on the inputs, another 220 picoseconds is required to establish a 1.7 volt difference on the outputs (IN and $\overline{IN}$) of the sense amplifier. Third, this particular arrangement for the sense amplifier dissipates quite a bit of power. Once the amplifier is turned on, the inputs of the amplifier go to full rail, or IN input goes to VDD while its complement goes to ground. This then feeds back to the bit lines, which then dissipates more power to precharge the bit lines in the input of the sense amplifier. Furthermore, latch circuits 25 and 27 are separate elements of sense amplifier 19, and are used to drive the output data to the comparator and MUXs. This requires additional circuits that induce added delay in the sense amplifier.

Figure 3:
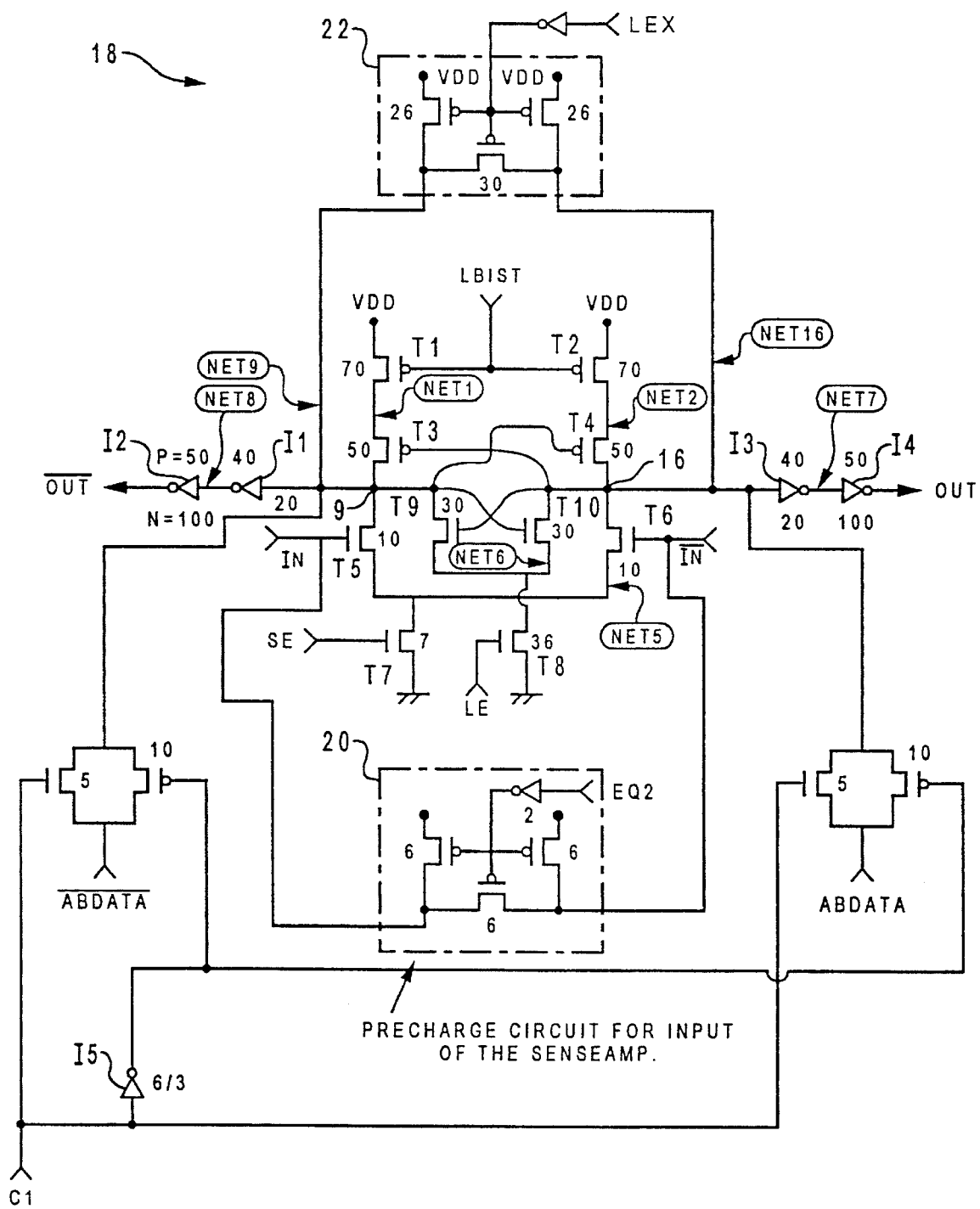
FIG. 3 is a schematic diagram of a sense amplifier according to the present invention.

Accordingly, a sense amplifier, which overcomes the problems and difficulties found in the prior art solutions, is illustrated in the schematic diagram of FIG. 3. Sense amplifier 18 in FIG. 3 is a detailed schematic diagram of the sense amplifier 18 illustrated in FIG. 1. Transistors T1, T2, T3, T4, T5, T6,and 77 form a differential sense amplifier, while transistors T1, T2, T3, T4, T8, T9, and T10 are arranged to serve as a dynamic sense amplifier. Transistors T1, T2, T3, T4 are pull-up P channel devices, or field effect transistors, while transistors T5–T10 are N channel MOSFETS. A latch circuit is incorporated in the dynamic sense amplifier and comprises transistors T1, T2, T3, T4, and T8, T9, T10. Transistors T8, T9, T10 hold data inside the latch circuit as received from the dynamic sense amplifier, This provides three different sets of transistors that interact to form a two mode sense amplifier having a latch integrated therein. The first set of transistors or switches is comprised of T1, T2, T3, and T4, while the second set of switches comprises transistors T5, T6, and T7, and the last, or third set of switches comprise transistors T8, T9, and T10.

Transistors T 1 and T2 are connected together through their gates, which are tied to a Logic Built-In Self-Test (LBIST) control line. One end of transistors T1 and T2 are tied to VDD, with T1 being further connected in series to T3 and with T2 being further connected in series to T4. T3 is further connected in series to T5 and T9 while T4 is further connected in series to T6 and T10. The gate of T3 is connected between T4 and T6 and T10, while the gate of T4 is connected between T3 and T5 and T9. T5 is further connected in series to T7, which has its gate tied to the sense enable or SE line. T5 is also further connected to the other end of T6. The junction between T3 and T5 forms node 9 (NET9). Node 9 is further connected to $\overline{OUT}$ line by invertors 11 and 12. The latch enable (LE) line connects to the gate of transistor TB, which has one end tied to ground and another end tied to the parallel combination of T9 and T10. T9 has its gate tied to the other end of T10 and the gate of T3, while T10 has its gate tied to the other end of T9 and to the gate of T4. The connection between T4 and T6 form node 16 (NET16), which also serves as OUT line, which is further connected to invertors 13 and 14 which then drive the OUT line.

The gate of T5 serves as the IN line and the gate of T6 serves as the $\overline{IN}$ line, each further connects to a precharge circuit 20, which uses a trio of pull-up P channel FETs for precharging the IN and $\overline{IN}$ lines when activated by the EQ2 line. A second precharger 22, arranged in the same fashion as precharger circuit 20, is used to precharge OUT and $\overline{OUT}$ lines at nodes 9 and 16, respectively. Precharge circuit 22 is activated by the LEX signal.

The output drivers of the sense amplifier is further used for testing comparators, MUXs, drivers, etc., by ON CHIP test logic. LBIST is asserted and control line C1 and its complement provided by invertor 15 are used to force data out to ABDATA and $\overline{ABDATA}$ lines. Node 9 connects to an N channel and P channel pair of FETs driven by the C1 line for outputting $\overline{\text{ABDATA}}$ line, while node 16 connects to a like N channel and P channel FET pair, which is driven by C1 line as well. Node 16 provides the output for ABDATA line.

At the beginning of a cycle, the LE and LEX lines are low and the EQ2 line is high. This action forces IN and $\overline{\text{IN}}$ lines, node 9 and node 16, and OUT and $\overline{\text{OUT}}$ lines to be precharged to VDD. As IN and $\overline{\text{IN}}$ lines are connected to the memory cells through the column decoder 16, when the word line goes high, the memory cells begin to drive the bit lines BL and $\overline{\text{BL}}$. Both bit lines are precharged to VDD at the beginning of the cycle. As soon as the word line goes high, one of the bit lines goes low; this depends on the data stored in the memory cell such that the high side node of the memory cell keeps its bit line high and the low side node of the memory cell forces the bit line to begin discharging. The IN and $\overline{\text{IN}}$ lines follow the bit line and complement bit line, respectively, since they are connected together through the column decoder. As soon as the word line goes high, the signal EQ2 line then goes low, thereby releasing the IN and $\overline{\text{IN}}$ lines.

Figure 4:
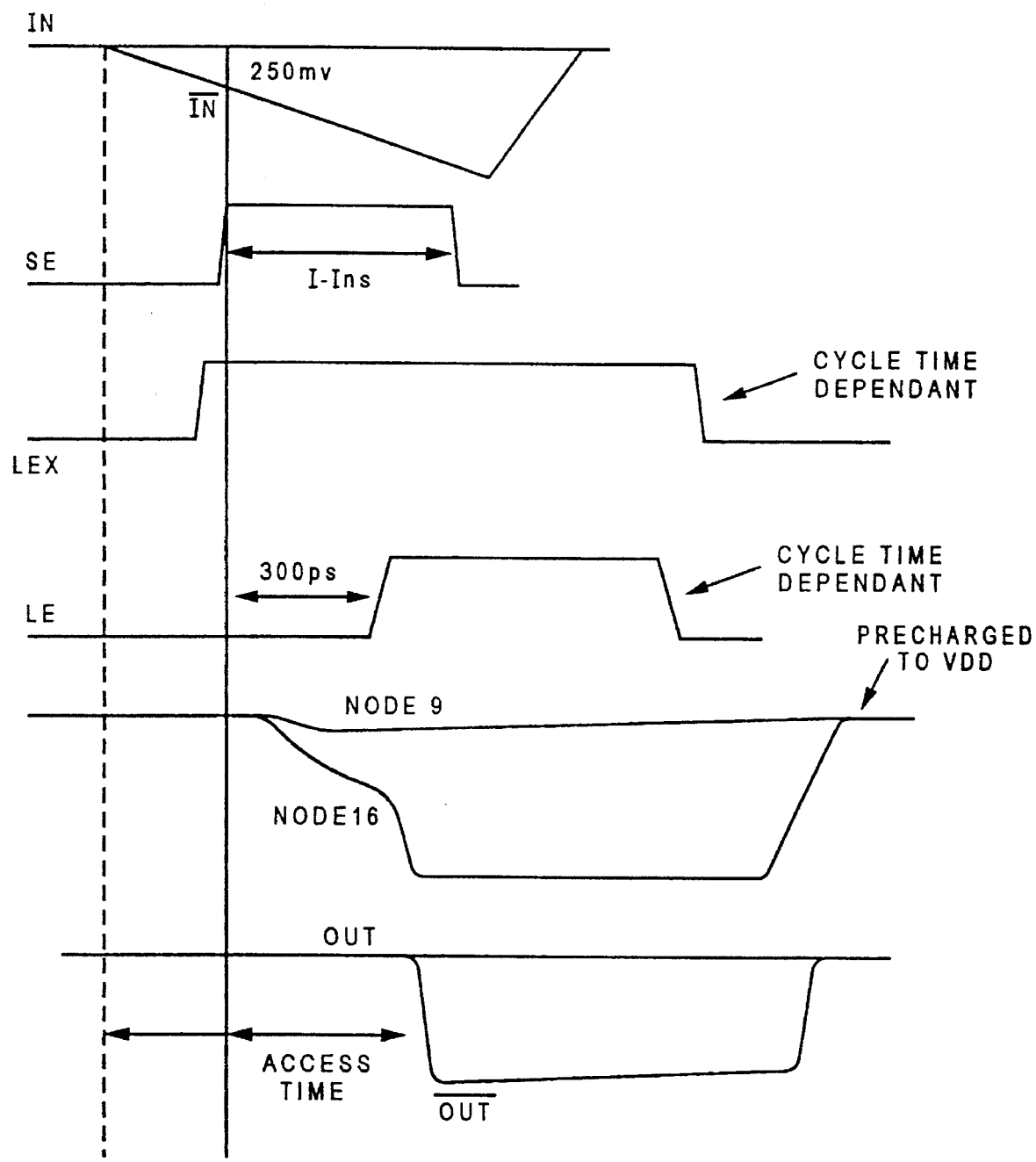
FIG. 4 depicts a timing relationship between signals and data.

Just before there is a 250 millivolts differential voltage developed on IN and $\overline{\text{IN}}$ lines, the LEX line is forced high and then at the 250 millivolts differential level the SE line is forced high. When LEX goes high, the precharge circuit turns off and releases node 9 and 16 and lines OUT and $\overline{\text{OUT}}$. When SE goes high, node 9 and 16, which were precharged to VDD, begin to develop differential voltage, which is shown in the graph in FIG. 4. As a small differential voltage develops on nodes 9 and 16, the control signal LE goes high, at approximately 300 picoseconds after the small differential voltage is developed. Once LE goes high, two paths to ground are formed. The first path is through transistor T9 and the second path is through T10. Depending upon the inputs, either node 9 or node 16 is pulled low very fast, while the others stay high, which is shown in the graph in FIG. 4. This action forces the OUT and $\overline{\text{OUT}}$ lines to follow node 16 and node 9, respectively. This results in OUT and $\overline{\text{OUT}}$ lines driving other circuits whose total capacitance is about 1 picofarad.

After a given time, about 1.1 nanoseconds, SE is turned off (FIG. 4), or goes low, and EQ2 goes high. When SE goes low, it turns off T7. The EQ2 signal then precharges the IN and $\overline{\text{IN}}$ lines to VDD. The control signals LE and LEX are still high and the latch is activated to drive both OUT and $\overline{\text{OUT}}$ signals. At this time, the latch is driving the data and the input of the sense amplifier is precharged to VDD.

After approximately 900 picoseconds (which varies with the clock cycle), first the LE and then the LEX signals go low. LE and LEX are forced low by the CLUG going low to high. Once the CLUG goes low, approximately 900 picoseconds later, LE and LEX will go low. When LE goes low, the latch is turned off and is ready to receive new data. When LEX goes low, it precharges node 9 and 16 and also OUT and $\overline{\text{OUT}}$ signals to VDD. The sense amplifier is now in a condition to receive new data. The 250 millivolt difference on the inputs of sense amplifier 18 requires about 610 picoseconds, while another 300 picoseconds passes before the sense amplifier develops 1.7 volts differential voltage on nodes 9 and 16. These results were based on a simulation of the sense amplifier 18 using a circuit simulator.

In the testing mode, the LBIST signal is controlled by a coprocessor on chip (COP). In the functional mode, the LBIST stays low. When the COP tests the comparators, MUXs, and drivers, the COP forces the LBIST to go high. This then forces the LE and SE signals to be low. LEX then goes high. This action then disables sense amplifier 18 and allows nodes 9 and 16 to float. C1 line then goes high, and COP forces the test data to node 9 and 16 through $\overline{\text{ABDATA}}$ and ABDATA lines, respectively. The signal OUT and $\overline{\text{OUT}}$ will then follow nodes 16 and 9, respectively. This sends the data to the comparators, MUXs, and drivers from the COP for testing. The advantages for the design for sense amplifier 18 is that it acts as both a differential sense amplifier and as a dynamic sense amplifier. During initial power up, sense amplifier 18 turns on slowly and then after about 300 pico seconds, it turns on harder. This allows sense amplifier 18 to recover from any noise or transient at the input of amplifier at the beginning of the cycle, since the gain is very low. This allows sense amplifier 18 to work as a differential sense amplifier.

Once LE goes high, 300 pico seconds after SE goes high, by this time, there is enough differential voltage developed on node 9 and node 16, sense amplifier 18 is turned on hard and pulls either node 9 or node 16 low very quickly. LE line engages the latch portion of sense amplifier 18, which allows it to work like a dynamic sense amplifier. The dynamic amplifier allows the gain to be infinite when the LE signal goes high, after the SE signal is high. Once the SE signal goes low, the latch is used to retain the data and keep driving the outputs. At this time, the inputs of sense amplifier 18 and the bit lines are precharged to VDD in preparation for the second cycle without losing any performance. This allows sense amplifier 18 to eliminate the additional latches that were previously required in the prior art sense amplifier of FIG. 2.

Another advantage of sense amplifier 18 is that it has low power dissipation since the inputs are not allowed to pull all the way to ground as in a typical dynamic sense amplifier. This is because the inputs sit at approximately VDD and 300 millivolts. At this time, the word lines are turned off and the bit lines and the input of sense amplifier are equalized to VDD. This further aids in reducing power dissipation as compared to a standard dynamic sense amplifier.

Also, since sense amplifier 18 has its own drivers, the ON CHIP tests of the comparator, MUXs and drivers, is able to use the sense amplifier drivers, rather than add additional circuits as in other prior art designs. This is accomplished by merely turning off the sense amplifier portion while allowing the data to be driven by the sense amplifier drivers.

Yet another benefit in the design used for sense amplifier 18 is that the input capacitance on the input signal has been greatly reduced. This is accomplished by the amplifier presenting a 20 picofarad load by the 10 micron gate as its only load on the input signal, as compared to a capacitive load of 135 picofarad in the prior art circuit of FIG. 2. This allows for a large differential voltage to be developed on the input of sense amplifier 18 before the SE signal goes high. This also allows for a faster operation by sense amplifier 18.

While the invention has been particularly shown and described with reference to a preferred embodiment, it will be understood by those skilled in the art that various changes in form and detail may be made therein without departing from the spirit and scope of the invention.

I claim:

1. A sense amplifier apparatus for use in a memory array having a plurality of memory cells, said apparatus comprising:

a differential sense amplifier and a dynamic sense amplifier, having a complementary pair of input lines and a complementary pair of output lines, and a first and second sense enable line;

the dynamic sense amplifier incorporating a latch for holding data;

a precharge circuit connected to said input lines for charging said pair of input lines;

an output precharge circuit for precharging said pair of output lines.

2. The sense amplifier apparatus of claim 1 wherein said differential sense amplifier comprises:

a first set of switches for driving voltages of said sense amplifier apparatus and coupled to said complementary pair of output lines;

a second set of switches, coupled to said first sense line and said complementary pair of input lines, whereby an input signal on either of said pair of input lines is amplified to a first signal level at a first rate of amplification.

3. The sense amplifier apparatus of claim 2 wherein said differential sense amplifier comprises:

a third set of switches, coupled to said complementary pair of said output lines and to said second sense enable line, whereby said first signal level is amplified to a second signal level at a second rate of amplification faster than said first rate of amplification.

4. The sense amplifier apparatus of claim 3 wherein said latch maintains said second signal level at about said second signal level.

5. The sense amplifier apparatus of claim 2 wherein a pair of switches within said second set of switches are coupled to one another and to said complementary pair of input lines so as to reduce impedance of an input signal.

6. The sense amplifier apparatus of claim 4 further comprising means for precharging said complementary pair of input lines in preparation for a next operation cycle.

7. A sense amplifier for amplifying a memory output signal of a memory array comprising:

a differential amplifier for amplifying said memory output signal at a first rate of amplification over a first period of time; and a dynamic amplifier, coupled to said differential amplifier, for sensing said amplified memory output signal and for amplifying said amplified memory signal at a second amplification rate higher than said first amplification rate over a second time period shorter than said first time period.

8. The sense amplifier of claim 7 wherein said dynamic amplifier further comprises a latch to hold said amplified memory output signal after being amplified by dynamic amplifier.

9. The sense amplifier of claim 7 wherein said differential amplifier and said dynamic amplifier are precharged prior to sensing in preparation for a subsequent sensing and amplification cycle.

10. The sense amplifier of claim 8 wherein said differential and dynamic amplifiers are precharged in preparation for a subsequent sensing and amplification cycle while said latch holds said amplified memory output signal.

11. In a CMOS memory array having a memory signal output line, a circuit for sensing and amplifying a memory signal output on said memory signal output line and generating an output, said circuit comprising:

a differential amplifier circuit precharged to a predetermined level prior to a sense operation;

a dynamic amplifier circuit having a latch circuit, coupled to an output from said differential amplifier circuit;

means, coupled to said differential amplifier and responsive to said memory signal output, for initiating a sense operation and for driving said differential amplifier circuit; and means, coupled to said dynamic amplifier circuit, for driving said dynamic amplifier after said differential amplifier circuit begins amplification.

12. The sensing and amplifying circuit of claim 11, wherein said latch holds said memory signal output from said memory array during subsequent memory output precharge operation.

13. The sensing and amplifying circuit of claim 11 further comprising a first precharge circuit for precharging an input of said sensing and amplifying circuit to a first predetermined state.

14. The sensing and amplifying circuit of claim 11 further comprising a second precharge circuit for precharging an output of said sensing and amplifying circuit to a second predetermined state.

15. The sensing and amplifying circuit of claim 11 wherein said output of said sensing and amplifying circuit is coupled to external means with test data.

\* \* \* \* \*